(12) United States Patent
Yuki et al.

(10) Patent No.: US 9,296,179 B2
(45) Date of Patent: Mar. 29, 2016

(54) POLYESTER FILM AND PHOTOSENSITIVE RESIN STRUCTURE

(75) Inventors: Kiwamu Yuki, Kyoto (JP); Kazuyoshi Yamazawa, Shizuoka (JP)

(73) Assignee: UNITKA LTD., Hyogo (JP)

( * ) Notice: Subject to any disclaimer, the term of this patent is extended or adjusted under 35 U.S.C. 154(b) by 246 days.

(21) Appl. No.: 13/978,654

(22) PCT Filed: Jan. 13, 2012

(86) PCT No.: PCT/JP2012/050537
§ 371 (c)(1),
(2), (4) Date: Jul. 8, 2013

(87) PCT Pub. No.: WO2012/098997
PCT Pub. Date: Jul. 26, 2012

(65) Prior Publication Data
US 2013/0295382 A1 Nov. 7, 2013

(30) Foreign Application Priority Data
Jan. 17, 2011 (JP) .................. 2011-006536

(51) Int. Cl.
| | | |
|---|---|---|
| *C09J 125/00* | (2006.01) | |
| *C09J 125/10* | (2006.01) | |
| *C09J 167/00* | (2006.01) | |
| *C09J 167/02* | (2006.01) | |
| *C09J 167/03* | (2006.01) | |
| *C09D 125/00* | (2006.01) | |
| *C09D 125/10* | (2006.01) | |
| *C09D 167/00* | (2006.01) | |
| *C09D 167/02* | (2006.01) | |
| *C09D 167/03* | (2006.01) | |
| *B32B 7/12* | (2006.01) | |
| *B32B 27/36* | (2006.01) | |
| *G03F 7/004* | (2006.01) | |
| *G03F 7/038* | (2006.01) | |
| *G03F 7/09* | (2006.01) | |
| *G03F 7/11* | (2006.01) | |
| *G03F 7/027* | (2006.01) | |
| *G03F 7/028* | (2006.01) | |
| *G03F 7/032* | (2006.01) | |
| *G03F 7/033* | (2006.01) | |
| *B32B 27/08* | (2006.01) | |
| *B32B 27/30* | (2006.01) | |
| *C09J 125/08* | (2006.01) | |
| *C09D 125/08* | (2006.01) | |

(52) U.S. Cl.
CPC . *B32B 7/12* (2013.01); *B32B 27/08* (2013.01); *B32B 27/302* (2013.01); *B32B 27/36* (2013.01); *G03F 7/033* (2013.01); *G03F 7/11* (2013.01); *B32B 2255/10* (2013.01); *B32B 2255/26* (2013.01); *B32B 2255/28* (2013.01); *B32B 2274/00* (2013.01); *B32B 2325/00* (2013.01); *B32B 2367/00* (2013.01); *B32B 2457/00* (2013.01); *C09D 125/08* (2013.01); *C09D 125/10* (2013.01); *C09D 167/00* (2013.01); *C09D 167/02* (2013.01); *C09D 167/03* (2013.01); *C09J 125/08* (2013.01); *C09J 125/10* (2013.01); *C09J 167/00* (2013.01); *C09J 167/02* (2013.01); *C09J 167/03* (2013.01); *C09J 2467/006* (2013.01); *G03F 7/004* (2013.01); *G03F 7/027* (2013.01); *G03F 7/028* (2013.01); *G03F 7/032* (2013.01); *G03F 7/038* (2013.01); *G03F 7/09* (2013.01); *Y10T 428/2848* (2015.01); *Y10T 428/31786* (2015.04); *Y10T 428/31797* (2015.04); *Y10T 428/31924* (2015.04); *Y10T 428/31931* (2015.04)

(58) Field of Classification Search
None
See application file for complete search history.

(56) References Cited

U.S. PATENT DOCUMENTS

| | | | |
|---|---|---|---|
| 4,252,885 A * | 2/1981 | McGrail et al. | 430/160 |
| 4,801,640 A * | 1/1989 | Dallmann et al. | 524/394 |
| 5,032,458 A * | 7/1991 | Dallmann et al. | 428/423.7 |
| 5,294,650 A * | 3/1994 | Sharma | 523/523 |
| 7,771,970 B2 | 8/2010 | Lee et al. | |
| 8,361,702 B2 | 1/2013 | Sugasaki | |
| 2003/0017281 A1* | 1/2003 | Mizutani et al. | 428/1.3 |
| 2004/0076844 A1* | 4/2004 | Tojo et al. | 428/480 |
| 2004/0086801 A1 | 5/2004 | Akahori et al. | |
| 2004/0265539 A1* | 12/2004 | Hashimoto et al. | 428/141 |
| 2005/0019555 A1* | 1/2005 | Yano et al. | 428/328 |
| 2007/0184262 A1* | 8/2007 | Yano et al. | 428/323 |
| 2008/0050583 A1* | 2/2008 | Kubo | 428/339 |
| 2008/0214699 A1 | 9/2008 | Halahmi et al. | |

(Continued)

FOREIGN PATENT DOCUMENTS

| | | |
|---|---|---|
| CN | 101263425 A | 9/2008 |
| CN | 101430505 | 5/2009 |

(Continued)

OTHER PUBLICATIONS

Japanese Office Action in Application No. 2011-006536, dated Sep. 24, 2014.

(Continued)

*Primary Examiner* — Vivian Chen
(74) *Attorney, Agent, or Firm* — Fildes & Outland, P.C.

(57) ABSTRACT

The present invention provides a polyester film wherein an adhesive layer including a thermoplastic elastomer including a monovinyl substituted aromatic hydrocarbon and a conjugated diene, a compatibilizer having a glass transition temperature of 35 to 150° C., and a polyester resin having a glass transition temperature of 35 to 150° C. and a carboxyl group content of 10 to 100 mg KOH/g is laminated on a polyester substrate.

10 Claims, No Drawings

(56) References Cited

U.S. PATENT DOCUMENTS

| | | | |
|---|---|---|---|
| 2008/0254385 A1* | 10/2008 | Yamazawa et al. | 430/286.1 |
| 2009/0068593 A1* | 3/2009 | Fujiwara et al. | 430/286.1 |
| 2009/0155721 A1* | 6/2009 | Yamazawa et al. | 430/287.1 |
| 2009/0176176 A1* | 7/2009 | Araki et al. | 430/286.1 |
| 2010/0136328 A1* | 6/2010 | Okuzu et al. | 428/336 |
| 2010/0143846 A1* | 6/2010 | Yamazawa | 430/306 |

FOREIGN PATENT DOCUMENTS

| | | | |
|---|---|---|---|
| EP | 1 209 524 | | 5/2002 |
| EP | 628 158 | | 2/2006 |
| JP | 59-174323 | | 10/1984 |
| JP | 9-68777 | | 3/1997 |
| JP | 2005-231119 | * | 9/2005 |
| JP | 2006-184840 | | 7/2006 |
| JP | 2007-079128 | | 3/2007 |
| JP | 4088584 | | 2/2008 |
| JP | 4433420 | | 1/2010 |
| JP | 2010-076439 | * | 4/2010 |
| JP | 2010-76439 | | 4/2010 |
| JP | 2010-155410 | | 7/2010 |
| WO | WO 2008/099595 | * | 8/2008 |

OTHER PUBLICATIONS

Chinese Office Action dated Sep. 15, 2014 in corresponding Chinese Patent Application No. 201280005514.5.
English language machine translation of abstract for JP 4433420.
English language abstract and machine translation for JP 2007-079128, which corresponds to CN101263425A.
English language abstract and machine translation for JP 2006-184840.
International Search Report in PCT/JP2012/050537 dated Apr. 17, 2012.
English language abstract and machine translation for JP 2010-155410.
English language abstract and machine translation for JP 2005-231119.
English language abstract and machine translation for JP 9-68777.
English language abstract for JP 59-174323.
Extended European Search Report in EP Patent Application No. 12736169.9 dated Aug. 5, 2015.
English language abstract and machine translation for 2010-76439.
Römpp online 4.0, Dokumentenkennung RD-07-01216, Jul. 1, 2007, Stuttgart, Ralf Hanselmann, "Glasübergangstemperatur."

* cited by examiner

POLYESTER FILM AND PHOTOSENSITIVE RESIN STRUCTURE

TECHNICAL FIELD

The present invention relates to a polyester film in which an adhesive layer excellent in adhesiveness with a photosensitive resin layer is laminated on a substrate, and a photosensitive resin structure using the polyester film.

BACKGROUND ART

Polyamide resins each involving a diamine and a dicarboxylic acid as the starting materials are widely used in various fields. The method for producing such a polyamide resin is generally as follows. Specifically, first, a nylon salt (polyamide salt) is prepared by using a diamine and a dicarboxylic acid, and the nylon salt is polymerized under pressure.

In the photosensitive resin structure used in relief printing, generally a photosensitive resin layer is laminated on a polyester film as a support. The method for obtaining a printing plate by making a photosensitive resin printing plate by using the photosensitive resin structure is as follows. Specifically, first, ultraviolet exposure (back exposure) is performed on the entire surface of the photosensitive resin layer through the polyester film to form a thin uniform cured layer. Next, a negative film is disposed on the photosensitive resin layer, image exposure (relief exposure) is performed on the photosensitive resin layer through the negative film, and thus the photosensitive resin layer is photocured according to the pattern of the negative film. Subsequently, the unexposed area (namely, uncured area) of the photosensitive resin layer is cleaned with a developing liquid to form an intended image, namely, a relief image, and thus a printing plate using a polyester film can be obtained. Recently, it has become possible to obtain a printing plate by performing direct exposure, without through the intermediary of a negative film, with a device such as a laser, or by applying, for example, a method in which exposure is performed after the removal of a black mask with a laser.

In the printing plate using a polyester film, obtained as described above, the photosensitive resin layer is usually as extremely thick as 1 mm or more and large in the cure shrinkage at the time of exposure, and hence there is an apprehension that the adhesiveness of the interface between the photosensitive resin and the polyester film is degraded. Usually, a printing plate is used under the condition that the polyester film surface is fixed, with a member such as a double-sided tape, to the plate cylinder of a printing press. However, in the case where a printing plate is used for printing, when the printing plate is made to pass between the plate cylinder and the impression cylinder of the printing press, shear stress is exerted to the printing plate so as to peel the photosensitive resin layer from the polyester film, and hence the printing is required to be ceased in some cases. When the printing plate is detached from the plate cylinder at the time of completion of the printing, the photosensitive resin layer and the polyester film are peeled from each other, and hence the printing plate is broken and cannot be reused in some cases.

In view of such current circumstances as described above, a printing plate in which a photosensitive resin layer and a polyester film are made to strongly adhere to each other so as not to be easily peeled from each other is demanded. However, the photosensitive resin layer and the polyester film are significantly different from each other in properties such as polarity, and hence it is difficult to make the photosensitive resin layer and the polyester film strongly adhere to each other.

In a laminate in which a photosensitive resin layer and a polyester film are laminated on each other through the intermediary of an adhesive layer, the composition of the photosensitive resin layer affects the adhesiveness of the adhesive layer in some cases. For example, the migration of the photopolymerization initiator and the ethylenically unsaturated compound included in the photosensitive resin layer into the adhesive layer causes the polymerization reaction in the adhesive layer at the time of exposure and hence the cure shrinkage of the adhesive layer is caused in some cases. Consequently, interfacial peeling occurs in some cases between the polyester film and the adhesive layer, or between the photosensitive resin layer and the adhesive layer.

Accordingly, for the purpose of developing sufficient adhesive force between the polyester film and the photosensitive resin layer, it is necessary to investigate the composition of the photosensitive resin layer. However, the photopolymerization initiator and the ethylenically unsaturated compound are essential components for imparting the photosensitivity. Accordingly, it is difficult to obtain a photosensitive resin layer having a strong adhesive force with the polyester film without impairing the intrinsic nature of the photosensitive resin layer.

Thus, a large number of investigations have been made on the adhesive for making the photosensitive resin layer and the polyester film adhere to each other. For example, an adhesive made of a reaction product between a mixture including a polyol having a polyester structure, a polyurethane structure, or both of these structures and a hydroxyl group-containing ethylenically unsaturated compound and a multifunctional isocyanate has been investigated (JP2001-264959A). However, in the case of JP2001-264959A, the adhesive force is not sufficient, and hence it is necessary to separately form a primer layer or an adhesive layer. Consequently, disadvantageously the steps become complicated or an increase in costs is caused.

An adhesive including an ethylene-vinyl acetate copolymer having a vinyl acetate content of 11 to 50% by mass has also been investigated (JP2004-109443A). However, in the case of JP2004-109443A, the thickness of the adhesive layer is extremely large, and adhesiveness is developed at normal temperature to an extent more than necessary in some cases. Accordingly, a release film for the prevention of adhesion is needed until the photosensitive layer is put into use, and hence disadvantageously the steps become complicated or an increase in costs is caused.

Another adhesive including an acrylic resin and/or an aromatic polyurethane resin has also been investigated (JP4067849B). Yet another adhesive including a reaction product between a polyol having a polyester structure, a polyurethane structure, or both of these structures and a hydroxyl group-containing ethylenically unsaturated compound has also been investigated (JP2000-155410A).

However, in the cases of the adhesives of JP4067849B and JP2000-155410A, it is difficult to satisfactorily adhere to all the photosensitive resins having various compositions, and it is essential to modify the composition of the photosensitive resin according to the adhesive. In other words, it is essential to use, in the photosensitive resin, various base polymers, various ethylenically unsaturated compounds, various photopolymerization initiators or plasticizers, for the purpose of imparting the hardness, flexibility and resolution optimal as the printing plate. However, if such substances are used, the affinity or the compatibility between the photosensitive resin and the adhesive layer is altered, and hence there is a possibility that the performances as the printing plate are impaired.

SUMMARY OF INVENTION

Technical Problem

The present invention intends to solve the foregoing problems, and an object of the present invention is to provide a polyester film capable of improving the adhesiveness to the photosensitive resin layer, with simple steps and low costs without needing a member such as a release film, and also without modifying the composition of the photosensitive resin layer, namely, without impairing the intrinsic nature of the photosensitive resin layer.

Solution to Problem

The present inventors performed a series of diligent studies for the purpose of solving the foregoing problems, and consequently, and have reached the present invention by discovering that the foregoing problems are solved by considering the composition of the adhesive layer constituting the polyester film.

Specifically, the gist of the present invention is as follows.

(1) A polyester film wherein an adhesive layer including a thermoplastic elastomer including a monovinyl substituted aromatic hydrocarbon and a conjugated diene, a compatibilizer having a glass transition temperature of 35 to 150° C., and a polyester resin having a glass transition temperature of 35 to 150° C. and a carboxyl group content of 10 to 100 mg KOH/g is laminated on a polyester substrate.

(2) The polyester film according to (1), being a base film for use in a photosensitive resin printing plate.

(3) A photosensitive resin structure wherein a photosensitive resin layer is disposed on the adhesive layer of the polyester film according to (1) or (2).

(4) The photosensitive resin structure according to (3), wherein the photosensitive resin layer includes a thermoplastic elastomer, an ethylenically unsaturated compound and a photopolymerization initiator.

(5) The photosensitive resin structure according to (4), wherein the thermoplastic elastomer included in the photosensitive resin layer includes a first polymer block including a conjugated diene unit or a hydrogenated conjugated diene unit and a second polymer block including a vinyl aromatic hydrocarbon unit.

(6) The photosensitive resin structure according to (4), wherein the thermoplastic elastomer included in the photosensitive resin layer includes a first polymer block including a butadiene unit or a hydrogenated butadiene unit and a second polymer block including a vinyl aromatic hydrocarbon unit.

Advantageous Effects of Invention

According to the present invention, it is possible to provide a polyester film in which an adhesive layer is laminated on a substrate, capable of strongly adhere to a photosensitive resin layer when made to adhere to the photosensitive resin layer, without modifying the composition of the photosensitive resin layer, namely, without impairing the intrinsic nature of the photosensitive resin layer.

Moreover, in the adhesive layer, the adhesiveness is not developed at normal temperature to an excessive extent, and hence the polyester film needs neither a release film nor the like until put into use; thus, the preparation steps of the polyester film and the photosensitive resin structure are simple, and it is possible to make the photosensitive resin layer and the polyester film adhere to each other in low costs.

DESCRIPTION OF EMBODIMENTS

Hereinafter, the present invention is described in detail. In the polyester film of the present invention, an adhesive layer is laminated on a polyester substrate as a support. By bonding the polyester film to the below-described photosensitive resin layer through the intermediary of the adhesive layer, a photosensitive resin structure to be used in relief printing can be obtained.

Examples of the polyester resin for forming the polyester substrate as the support may include polyethylene terephthalate, polybutylene terephthalate and polyethylene naphthalate. Among these, polyethylene terephthalate is preferable from the viewpoint of mechanical properties, processing properties or costs. The polyester substrate may be subjected to, if necessary, surface treatments such as corona treatment, plasma treatment, flame treatment and chemical treatment with alkali.

The thickness of the polyester substrate is preferably 30 to 300 μm and more preferably 75 to 200 μm. When the thickness is less than 30 μm, the strength required as the support is not sufficient in some cases, and when the thickness exceeds 300 μm, an increase in costs is caused, and the flexibility as the printing plate is not sufficient in some cases.

The adhesive layer laminated on the polyester substrate includes a thermoplastic elastomer including a monovinyl substituted aromatic hydrocarbon and a conjugated diene, a compatibilizer and a polyester resin.

The thermoplastic elastomer included in the adhesive layer assumes the role of improving the adhesiveness between the adhesive layer and the polyester substrate. When the below-described photosensitive resin layer is disposed on the adhesive layer, the thermoplastic elastomer assumes the role of improving the adhesiveness between the adhesive layer and the photosensitive resin layer.

In the present invention, the thermoplastic elastomer included in the adhesive layer includes a monovinyl substituted aromatic hydrocarbon and a conjugated diene as the constituent units.

Examples of the monovinyl substituted aromatic hydrocarbon constituting the thermoplastic elastomer included in the adhesive layer include: styrene, t-butyl styrene, divinylbenzene, 1,1-diphenylstyrene, N,N-dimethyl-p-aminoethylstyrene, N,N-diethyl-p-aminoethylstyrene, vinylpyridine, p-methylstyrene, p-methoxystyrene, tertiary-butyl styrene, α-methylstyrene and 1,1-diphenylethylene. Among these, styrene is preferable from the viewpoint of the laminatability of the adhesive layer. The monovinyl substituted aromatic hydrocarbons can be used each alone or in combinations of two or more thereof.

Examples of the conjugated diene constituting the thermoplastic elastomer included in the adhesive layer include 1,3-butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene and chloroprene. Among these, 1,3-butadiene is preferable from the viewpoint of the laminatability of the adhesive layer. These conjugated dienes are used each alone or in combinations of two or more thereof.

The number average molecular weight of the thermoplastic elastomer included in the adhesive layer is preferably 20,000 to 300,000 and more preferably 50,000 to 200,000 from the viewpoint of the viscosity at normal temperature. The number average molecular weight is a molecular weight measured by gel permeation chromatography (GPC) relative to polystyrene standards.

The thermoplastic elastomer is a block copolymer including as the constituent units a monovinyl substituted aromatic hydrocarbon and a conjugated diene. Examples of such a block copolymer include the linear block copolymers represented by the following group of formulas (I) or the linear block copolymers or the radial block copolymers represented by the following group of formulas (II).

$$(A-B)n$$

$$A-(B-A)n$$

$$A-(B-A)n-B$$

$$B-(A-B)n \qquad (I)$$

$$[(A-B)k]m-X$$

$$[(A-B)k-A]m-X$$

$$[(B-A)k]m-X$$

$$[(B-A)k-B]m-X \qquad (II)$$

In the groups of formulas (I) and (II), A represents a monovinyl substituted aromatic hydrocarbon; B represents a conjugated diene; X represents, for example, the residues of the coupling agents such as silicon tetrachloride, tin tetrachloride, epoxidized soybean oil, polyhalogenated hydrocarbon compounds, carboxylic acid ester compounds, polyvinyl compounds, bisphenol-type epoxy compounds, alkoxysilane compounds, halogenated silane compounds and ester-based compounds, or the residues of the polymerization initiators such as multifunctional organolithium compounds; and n, k and m each represent an integer of 1 or more, and are each, for example, 1 to 5.

In the thermoplastic elastomer included in the adhesive layer, from the viewpoint of the adhesiveness, the copolymerization ratio between the monovinyl substituted aromatic hydrocarbon and the conjugated diene, monovinyl substituted aromatic hydrocarbon/conjugated diene is preferably 20/80 to 80/20 and more preferably 30/70 to 60/40.

The thermoplastic elastomer is also included in the below-described photosensitive resin layer in some cases. In such a case, from the viewpoint of achieving a higher adhesiveness, the styrene proportion in the thermoplastic elastomer of the adhesive layer and the styrene proportion in the elastomer of the photosensitive resin layer are preferably close to each other and more preferably equal to each other.

In the thermoplastic elastomer, if necessary, other functional groups may be introduced, chemical modifications such as hydrogenation may be performed, or other components may be copolymerized.

The content of the thermoplastic elastomer in the adhesive layer is, from the viewpoint of the adhesiveness, preferably 10 to 80% by mass and more preferably 30 to 60% by mass.

The compatibilizer included in the adhesive layer assumes the role of compatibilizing the thermoplastic elastomer and the polyester resin with each other. Specifically, the elastomer component contributes to the adhesion to the photosensitive resin layer and the polyester component contributes to the adhesion to the polyester film as the base film. However, the elastomer component and the polyester component are generally incompatible with each other, and hence the compatibilization in the coating material solution and the adhesive layer each including a mixture of these components is insufficient, and a strong phase separation occurs. In such a case, the breaking strength of the adhesive layer is lowered, and even when the photosensitive resin layer and the base film can be made to adhere to each other, there occurs a failure such that the photosensitive resin layer and the base film are peeled from each other due to the breakage of the adhesive layer, or the adhesive force to the photosensitive resin layer or the base film is insufficient. For the purpose of preventing such a failure, by using the compatibilizer, the thermoplastic elastomer and the polyester resin are sufficiently compatibilized with each other.

The examination of the compatibilized state is performed as follows. Specifically, the coating material solution is prepared so as to have a volume of 200 ml, the solution is placed in a cylindrical glass vessel (beaker) of 6 cm in diameter, the solution is stirred at 500 rpm for 5 minutes with a magnetic stirrer by using a 30 mm (length)×8 mm (diameter) magnet rotor (for example, a spindle-shaped, octagonal column-shaped, or rod-shaped rotor), and then the solution was allowed to stand still, the phase-separated state is observed at 5 minutes from the end of the stirring, and thus, the compatibilized state can be examined. In this case, when no phase separation occurs or the phase separation occurs but the separated layer (the layer having the smaller volume fraction) is 1 cm or less in thickness, it is possible to determine that the compatibilization is successfully performed.

Specific examples of the compatibilizer include: acrylic monomer, acrylic oligomer, polyurethane, styrene monomer, styrene oligomer, polystyrene, polybutadiene, nitrile rubber, chloroprene rubber, epoxy resin, acrylic resin, polyvinyl chloride, chlorinated rubber, polyvinyl acetate, polyester, polyamide, phenolic resin, urea resin, melamine resin, polyether, polyarylate, polyimide, polyolefin, polyvinyl alcohol, polydimethylsiloxane, polythiophene, polypyrrole, polyether ether ketone, polyphenylene sulfide, ionomer, polyacrylonitrile, polycarbonate and fluororesin; the oligomer of these; the copolymers of these; and the chemically modified products of these, prepared by introducing, for example, functional groups or substituents.

Examples of the substituent and the functional groups to be introduced include: an alkyl group, an amino group, a carboxyl group, a hydroxyl group, a carbonyl group, an epoxy group, an allyl group, an acyl group, a cyano group, a halogen group, an isocyanate group, a carbodiimide group, an oxazoline group and an aromatic group; residues having UV absorbance made of, for example, an azo compound, and a benzophenone-based compound or a benzotriazole-based compound; and residues made of compounds as combinations of two or more, namely, a plurality of these through chemical bonding.

Among these compounds, polyvinyl acetate, acrylic resin and styrene-acryl copolymer resin are preferable, from the viewpoint of the glass transition temperature.

More preferable is the compound in which a functional group such as an amino group, a carboxyl group, or a residue made of a compound including these groups is introduced.

As the compatibilizer, commercially available compatibilizers can also be suitably used. Specific examples of such commercially available compatibilizers include: Gohsefimer L-7514 (manufactured by Nippon Synthetic Chemical Industry Co., Ltd.), Aron S-1001 (manufactured by Toagosei Co., Ltd.), Aron S-1017 (manufactured by Toagosei Co., Ltd.), ARUFON UFX-5000 (manufactured by Toagosei Co., Ltd.), ARUFON XG-4050 (manufactured by Toagosei Co., Ltd.), ARUFON UM-9030 (manufactured by Toagosei Co., Ltd.), POLYMENT NK-350 (manufactured by Nippon Shokubai Co., Ltd.), POLYMENT NK-380 (manufactured by Nippon Shokubai Co., Ltd.), Vanaresin PSY-C1 (manufactured by Shin-Nakamura Chemical Co., Ltd.), Evaflex 40 W•X (manufactured by Du Pont-Mitsui Polychemical Co., Ltd.), Aron SP-1350 (manufactured by Toagosei Co., Ltd.), Vanaresin UVA (manufactured by Shin-Nakamura Chemical Co., Ltd.), ACRYDIC (manufactured by DIC Corp.), and ULS (manufactured by Ipposha Oil Industries Co., Ltd.).

The glass transition temperature of the compatibilizer is required to be 35 to 150° C., and is preferably 60 to 120° C. When the glass transition temperature is lower than 35° C., the adhesiveness at normal temperature is developed to an extent more than necessary, depending on the selection of the other adhesive layer components, and hence a release film for the prevention of adhesion is needed until the polyester film is put into use. On the other hand, when the glass transition temperature exceeds 150° C., a higher temperature is required when bonded to the photosensitive resin layer, and hence the handleability is degraded to increase the costs, and additionally, adhesion failure is developed or the photosensitive resin is degraded in some cases. The glass transition temperature of the compatibilizer is determined by differential scanning calorimetry.

The compatibilizer may be a mixture of two or more types of compatibilizers. In such a case, the glass transition temperature of the compatibilizer is taken as the sum of the products of the glass transition temperature and the mass fraction of the individual compatibilizers.

The content of the compatibilizer in the adhesive layer is preferably 10 to 50% by mass and more preferably 20 to 40% by mass. When the content of the compatibilizer in the adhesive layer deviates from the foregoing range, the adhesive force is decreased in some cases.

The polyester resin included in the adhesive layer assumes the role of making the polyester substrate and the adhesive layer adhere to each other.

The glass transition temperature of the polyester resin is required to be 35 to 150° C. and is preferably 60 to 120° C. When the glass transition temperature is lower than 35° C., the adhesiveness at normal temperature is developed to an extent more than necessary, depending on the selection of the other components in the adhesive layer, and hence a release film for the prevention of adhesion is needed until the polyester film is put into use. On the other hand, when the glass transition temperature exceeds 150° C., a higher temperature is required when bonded to the photosensitive resin layer, and hence the handleability is degraded to increase the costs, and additionally, adhesion failure is developed or the photosensitive resin is degraded in some cases. The glass transition temperature of the polyester resin is determined by differential scanning calorimetry.

The polyester resin may be a mixture of two or more types of polyester resins. In such a case, the glass transition temperature of the polyester resin is taken as the sum of the products of the glass transition temperature and the mass fraction of the individual polyester resins.

The carboxyl group content of the polyester resin is required to be 10 to 100 mg KOH/g and is preferably 20 to 80 mg KOH/g. When the carboxyl group content is less than 10 mg KOH/g, the adhesive force is decreased in some cases. On the other hand, when the carboxyl group content exceeds 100 mg KOH/g, the molecular weight of the polyester resin is decreased, and the intended glass transition temperature is not obtained in some cases. The method for determining the carboxyl group content in the present invention is described in below-described Examples.

The content of the polyester resin in the adhesive layer is preferably 10 to 70% by mass and more preferably 20 to 50% by mass. When the content of the polyester resin in the adhesive layer deviates from the foregoing range, the adhesive force is decreased in some cases.

In the present invention, the polyester resin used in the adhesive layer can be conventionally obtained by using a polybasic acid and a polyhydric alcohol.

Examples of the polybasic acid may include: aromatic dicarboxylic acids such as terephthalic acid, isophthalic acid, orthophthalic acid, naphthalene dicarboxylic acid and biphenyl dicarboxylic acid; aliphatic dicarboxylic acids such as saturated dicarboxylic acids such as oxalic acid, (anhydrous) succinic acid, adipic acid, azelaic acid, sebacic acid, dodecanedioic acid and hydrogenated dimer acid, and unsaturated dicarboxylic acids such as fumaric acid, (anhydrous) maleic acid, (anhydrous) itaconic acid, (anhydrous) citraconic acid and dimer acid; and alicycic dicarboxylic acids such as 1,4-cyclohexanedicarboxylic acid, 1,3-cyclohexanedicarboxylic acid, 1,2-cyclohexanedicarboxylic acid, 2,5-norbornenedicarboxylic acid and tetrahydrodicarboxylic acid. Additionally, for example, 5-sodium sulfoisophthalate and 5-hydroxyisophthalic acid can be used, if necessary.

Examples of the polyhydric alcohol may include glycols such as aliphatic glycols having 2 to 12 carbon atoms, alicyclic glycols having 6 to 12 carbon atoms and ether bond-containing glycols.

Examples of the aliphatic glycols having 2 to 12 carbon atoms include ethylene glycol, 1,2-propylene glycol, 1,3-propanediol, 1,4-butanediol, 2-methyl-1,3-propanediol, 1,5-pentanediol, neopentylglycol, 1,6-hexanediol, 3-methyl-1,5-pentanediol, 1,9-nonanediol and 2-ethyl-2-butylpropanediol.

Examples of the alicyclic glycols having 6 to 12 carbon atoms may include 1,4-cyclohexanedimethanol, 1,3-cyclohexanedimethanol and 1,2-cyclohexanedimethanol. Examples of the ether bond-containing glycols may include diethylene glycol, triethylene glycol and dipropylene glycol, and additionally, glycols obtained by adding ethylene oxide or propylene oxide to the phenolic hydroxyl groups of bisphenols, such as 2,2-bis(4-hydroxyethoxyphenyl)propane. Glycols such as polyethylene glycol, polypropylene glycol and polytetramethylene glycol can also be used, if necessary.

As the polyester resin used in the adhesive layer, from the viewpoint of the carboxyl group content, the polyester resins obtained by copolymerizing a tri- or more functional polybasic acid and/or polyhydric alcohol are preferable. Examples of the tri- or more functional polybasic acid include (anhydrous) trimellitic acid, (anhydrous) pyromellitic acid, (anhydrous) benzophenone tetracarboxylic acid, trimesic acid, ethylene glycol bis(anhydrotrimellitate), glycerol tris (anhydrotrimellitate) and 1,2,3,4-butane tetracarboxylic acid. Examples of the tri- or more functional polyhydric alcohol include glycerin, trimethylolethane, trimethylolpropane and pentaerythritol.

For the polyester resin used in the adhesive layer, additionally if necessary, the following compounds may be used: fatty acids such as lauric acid, myristic acid, palmitic acid, stearic acid, oleic acid, linoleic acid and linolenic acid, and the ester-forming derivatives of these; monocarboxylic acids such as benzoic acid, p-tert-butylbenzoic acid, cylohexanoic acid and 4-hydroxyphenylstearic acid; monoalcohols such as stearyl alcohol and 2-phenoxyethanol; hydroxycarboxylic acids such as ε-caprolactone, lactic acid, β-hydroxybutyric acid and p-hydroxybenzoic acid, and the ester-forming derivatives of these.

The polyester resin used in the adhesive layer is obtained by polymerizing the foregoing monomers by using heretofore known methods. For example, any of the following methods (1) to (3) can be used.

(1) All the monomer components and/or the low polymer thereof are subjected to esterification reaction in an inert atmosphere such as a nitrogen gas atmosphere at 180 to 250° C. for about 2.5 to 10 hours, and successively the polycondensation reaction of the reaction mixture is allowed to proceed in the presence of a catalyst such as germanium dioxide under a reduced pressure of 100 Pa or less at a temperature of 220 to 280° C. until the intended melt viscosity is reached, to yield the polyester resin.

(2) The polycondensation reaction in the foregoing (1) is terminated at a stage where the intended melt viscosity is not yet reached, and the reaction product obtained by the polycondensation reaction is mixed with the chain extender selected, for example, from the multifunctional epoxy compound, isocyanate compound and oxazoline compound and the resulting mixture is allowed to react for a short period of time to achieve a high molecular weight of the product.

(3) The polycondensation reaction in the foregoing (1) is allowed to proceed to a stage where the melt viscosity is equal to or larger than the intended melt viscosity, and then the monomer components are further added and the depolymerization is performed in an inert atmosphere in an normal pressure system to a pressurized system, to yield a polyester resin having the intended melt viscosity.

Further, by the following methods (a), (b) and (c), without causing, for example, side reactions and gelation, a specific amount of the carboxyl group can be introduced into the obtained high molecular weight polyester resin.

(a) In the foregoing method (1), a tri- or more functional polybasic acid component is added after the start of the polycondensation reaction, or the acid anhydride of a polybasic acid is added immediately before the termination of the polycondensation reaction.

(b) In the foregoing method (2), the low molecular weight polyester resin in which most of the molecular chain terminals are carboxyl groups is allowed to acquire a high molecular weight by using a chain extender.

(c) In the foregoing method (3), a polybasic acid component is uses as the depolymerizing agent.

Among the above-described (a) to (c), (c) is most preferable from the viewpoint of the highest easiness in controlling the content of the carboxyl group-containing acid.

In the adhesive layer, within a range not impairing the advantageous effects of the present invention, additives such as a lubricant such as silica or talc, a tackifier, a polymerization initiator, a cross-linking agent, a plasticizer, a thermal polymerization inhibitor and a colorant may be added.

The thickness of the adhesive layer is preferably 0.01 to 20 μm and more preferably 0.5 to 10 μm. When the thickness is less than 0.01 μm, no sufficient adhesive force is obtained in some cases. On the other hand, when the thickness exceeds 20 μm, the amount of the adhesive used is increased to cause an increase in costs in some cases.

The method for laminating the adhesive layer on the polyester substrate is not particularly limited, and as such a method, a common coating method can be used. Examples of such a method include a method in which an adhesive to form the adhesive layer is dissolved and mixed in a solvent such as toluene or methyl ethyl ketone (MEK), and the resulting solution is applied to the polyester substrate by using a rotary coater such as a bar coater, a gravure coater or a die coater.

The polyester film in which the adhesive layer formed on the surface of the polyester substrate is finally wound around a cylinder made of a material such as paper or plastic. In this case, when the adhesive layer has an adhesiveness to an extent more than necessary, the film adheres to itself so as to prevent the film from being peeled off from itself. Alternatively, even when the film can be peeled off from itself, the adhesive layer is transferred to the adjacent adhesive layer-uncoated side of the polyester substrate to cause a partial loss of the adhesive layer, and thus the polyester film is made unusable (this phenomenon is referred to as blocking). Accordingly, when the adhesiveness of the adhesive layer is too strong, a release film to prevent the blocking is needed. The release film is peeled off and discarded when the photosensitive resin layer and the polyester film are bonded to each other. Consequently, the step and the cost for disposing the release film, and the step and cost for discarding the release film are needed, and hence the adhesion step becomes complicated or an increase in costs is caused in some cases. Also, from the viewpoint of the operability, the release film is unfavorable in some cases.

The photosensitive resin layer includes a thermoplastic elastomer, an ethylenically unsaturated compound, and a photopolymerization initiator.

Examples of the thermoplastic elastomer included in the photosensitive resin layer include styrene.butadiene block copolymer, styrene.isoprene block copolymer, and styrene-.ethylene/butylene block copolymer.

Examples of the thermoplastic elastomer included in the photosensitive resin layer include a thermoplastic elastomer block copolymer including a first polymer block including a conjugated diene unit or a hydrogenated conjugated diene unit and a second polymer block including a vinyl aromatic hydrocarbon unit. Here, the conjugated diene unit, the hydrogenated conjugated diene unit and the vinyl aromatic hydrocarbon unit may be used each alone or in combinations of two or more thereof.

In the first polymer block including the conjugated diene unit or the hydrogenated conjugated diene unit, the conjugated diene unit or the hydrogenated conjugated diene unit is included in a content of preferably 50% by mass or more, further preferably 80% by mass or more and particularly preferably 90% by mass or more.

In the second polymer block including the vinyl aromatic hydrocarbon unit, the vinyl aromatic hydrocarbon unit is included in a content of preferably 50% by mass or more, further preferably 80% by mass or more and particularly preferably 90% by mass or more.

Examples of the thermoplastic elastomer included in the photosensitive resin layer include, in addition to the foregoing examples: olefin-based thermoplastic elastomers such as EPDM (ethylene propylene rubber) and propylene.ethylene/propylene block copolymer; polyurethane-based thermoplastic elastomers; polyester-based thermoplastic elastomers; polyamide-based thermoplastic elastomers; vinyl chloride-based thermoplastic elastomers; fluorine-based thermoplastic elastomers; and silicone-based thermoplastic elastomers. These thermoplastic elastomers may be used each alone or in combinations of two or more thereof.

Among the foregoing thermoplastic elastomers, from the viewpoint of achieving satisfactory moldability, preferable are the olefin-based thermoplastic elastomers such as the thermoplastic elastomer block copolymer including the first polymer block including the conjugated diene unit or the hydrogenated conjugated diene unit and the second polymer block including the vinyl aromatic hydrocarbon unit; EPDM; and propylene.ethylene/propylene block copolymer.

Within a range not impairing the object of the present invention, completely hydrogenated products of conjugated diene blocks such as styrene-ethylene-butylene block copolymer and styrene-ethylene-propylene block copolymer may be used in combination.

When the polymer block including the conjugated diene unit is, for example, a copolymer between a vinyl aromatic hydrocarbon and butadiene, the vinyl aromatic hydrocarbon in the copolymer block may be distributed uniformly or nonuniformly (for example, in a tapered shape). The uniformly distributed portions and/or the nonuniformly distributed portions may be concomitantly present in multiple numbers in the individual copolymer blocks.

Examples of the block copolymer of the thermoplastic elastomer included in the photosensitive resin layer include the linear block copolymers represented by the following group of formulas (III), or the linear block copolymers or the radical block copolymers represented by the following group of formulas (IV).

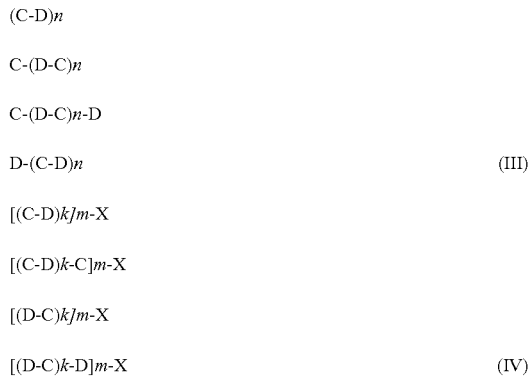

In the foregoing groups of formulas (III) and (IV), C represents a monovinyl substituted aromatic hydrocarbon. D represents a conjugated diene; X represents, for example, the residues of the coupling agents such as silicon tetrachloride, tin tetrachloride, epoxidized soybean oil, polyhalogenated hydrocarbon compounds, carboxylic acid ester compounds, polyvinyl compounds, bisphenol-type epoxy compounds, alkoxysilane compounds, halogenated silane compounds and ester-based compounds, or the residues of the polymerization initiators such as multifunctional organolithium compounds; and n, k and m each represent an integer of 1 or more, and are each, for example, 1 to 5.

The conjugated diene unit means a unit in which the monomer constituting the unit in a polymer block is a conjugated diene. Examples of the conjugated diene unit include the monomers such as 1,3-butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene and chloroprene. In particular, 1,3-butadiene is preferable from the viewpoint of the wear and abrasion resistance of the finally obtained printing plate. These conjugated diene units may be used each alone or in combinations of two or more thereof.

The vinyl content, such as the content of 1,2-butadiene or 3,4-isoprene, in the total amount of the conjugated dienes in the polymer block including conjugated dienes is not particularly limited.

The hydrogenated conjugated diene unit means the hydrogenated product of the conjugated diene unit and the hydrogenation method is not particularly limited. The hydrogenated products of the conjugated diene units may be used each alone or in combinations of two or more thereof.

The vinyl aromatic hydrocarbon unit means a unit in which the monomer constituting the unit in the polymer block is a vinyl aromatic hydrocarbon. Examples of the vinyl aromatic hydrocarbon unit include the monomers such as styrene, t-butyl styrene, divinylbenzene, 1,1-diphenylstyrene, N,N-dimethyl-p-aminoethylstyrene, N,N-diethyl-p-aminoethylstyrene, vinylpyridine, p-methylstyrene, tertiary-butyl styrene, α-methylstyrene and 1,1-diphenylethylene. Among these monomers, styrene is preferable from the viewpoint that the photosensitive resin structure can be molded smoothly at a relatively low temperature. These monomers may be used each alone or in combinations of two or more thereof.

The content of the vinyl aromatic hydrocarbon unit in the whole block copolymer, namely the block copolymer including both of the C and D is preferably 25% by mass or less, from the viewpoint of ensuring the satisfactory moldability of the photosensitive resin structure. Also, the content of the vinyl aromatic hydrocarbon unit is 13% by mass or more, from the viewpoint that the cold-flow resistance of the photosensitive resin structure is high. The content of the vinyl aromatic hydrocarbon unit in the block copolymer is determined by measuring the absorption intensity at a wavelength of 262 nm with an ultraviolet spectrophotometer (for example, trade name: UV200, manufactured by Hitachi, Ltd.).

When an olefin-based thermoplastic elastomer is used as the thermoplastic elastomer included in the photosensitive resin layer, from the viewpoint that the olefin-based thermoplastic elastomer can impart a high resolution property to the target printing plate, the content of the ethylene unit component is preferably 50% by mass to 90% by mass and the content of the diene unit component is preferably 10% by mass or less. Further, the content of the ethylene unit component is more preferably 60% by mass to 80% by mass and the content of the diene unit component is more preferably 5% by mass or less. The contents of the ethylene unit component and the diene component unit are the values measured by using a nuclear magnetic resonance apparatus (NMR).

The number average molecular weight (Mn) of the thermoplastic elastomer included in the photosensitive resin layer is preferably 20,000 to 250,000, more preferably 30,000 to 200,000 and furthermore preferably 40,000 to 150,000, from the viewpoint of ensuring the cold-flow resistance of the photosensitive resin structure. The number average molecular weight (Mn) is a molecular weight measured by gel permeation chromatography (GPC) relative to polystyrene standards.

The softening temperature of the thermoplastic elastomer included in the photosensitive resin layer is preferably 50 to 250° C., more preferably 60 to 250° C., furthermore preferably 80 to 200° C. and yet furthermore preferably 80 to 140° C. When the softening temperature is 50° C. or higher, the thermoplastic elastomer is solid at normal temperature, and hence the thermoplastic elastomer processed into a sheet shape or a cylindrical shape can be easily handled without deforming the thermoplastic elastomer. When the softening temperature is 250° C. or lower, the thermoplastic elastomer can be processed into a sheet shape or a cylindrical shape and the quality change or the decomposition of the other compounds to be mixed can be prevented. The softening temperature can be measured with a dynamic viscoelasticity measurement apparatus. Specifically, the temperature of the object is increased from room temperature, and the first temperature at which the viscosity coefficient changes largely (the slope of the viscosity coefficient curve changes) defines the softening temperature.

The content of the thermoplastic elastomer in the photosensitive resin layer is set preferably within a range from 50 to 90% by mass and more preferably within a range from 60 to 75% by mass in relation to the total amount of the photosensitive resin expressed as 100% by mass, from the viewpoint of the printing durability of the printing plate in the step of preparing the photosensitive resin.

Examples of the ethylenically unsaturated compound included in the photosensitive resin layer include: olefins such as ethylene, propylene, vinyltoluene, styrene and divinylbenzene; acetylenes; (meth)acrylic acid and/or the derivatives thereof; haloolefins; unsaturated nitriles such as acrylonitrile; derivatives of acrylamide and methacrylamide; unsaturated dicarboxylic acids and the derivatives thereof such as maleic anhydride, maleic acid and fumaric acid; vinyl acetates; N-vinylpyrrolidone; N-vinylcarbazole; and N-substituted maleimide compounds. Among these, (meth)acrylic acid and/or the derivatives thereof are preferable from the viewpoint of being abundant in types.

Examples of the foregoing derivatives include: alicyclic compounds having a cycloalkyl group, a bicycloalkyl group, a cycloalkenyl group or a bicycloalkenyl group; aromatic compounds having a benzyl group, a phenyl group, a phenoxy group, a naphthalene skeleton, an anthracene skeleton, a biphenyl skeleton, a phenanthrene skeleton or a fluorene skeleton; compounds having an alkyl group, a halogenated alkyl group, an alkoxyalkyl group, a hydroxyalkyl group, an aminoalkyl group or a glycidyl group; ester compounds with polyhydric alcohols such as alkylene glycol, polyoxyalkylene glycol, polyalkylene glycol and trimethylolpropane; and compounds having a polysiloxane structure such as polydimethylsiloxane or polydiethylsiloxane. The foregoing derivatives may also be heterocyclic aromatic compounds that contain elements such as nitrogen and sulfur.

Specific examples of the (meth)acrylic acid and/or the derivatives thereof include: diacrylates and dimethacrylates of alkanediols such as hexanediol and nonanediol; diacrylates and dimethacrylates of ethylene glycol, diethylene glycol, propylene glycol, dipropylene glycol, polyethylene glycol and butylene glycol; trimethylolpropane tri(meth)acrylate; dimethyloltricyclodecane di(meth)acrylate; isoboronyl (meth)acrylate; phenoxypolyethylene glycol (meth)acrylate; and pentaerythrit tetra(meth)acrylate. These may be used each alone or in combinations of two or more thereof.

The number average molecular weight (Mn) of the ethylenically unsaturated compound is preferably 100 or more from the viewpoint of ensuring non-volatility, preferably less than 1,000 from the viewpoint of the compatibility with the thermoplastic elastomer, and is more preferably 200 to 800. Here, the number average molecular weight (Mn) is a molecular weight measured by gel permeation chromatography (GPC) relative to polystyrene standards.

The ethylenically unsaturated compound is preferably an organic compound having a polymerizable unsaturated group from the viewpoint of the printing durability of the printing plate.

The content of the ethylenically unsaturated compound in the photosensitive resin layer is preferably within a range from 5 to 25% by mass and more preferably within a range from 7 to 15% by mass in relation to the total amount of the photosensitive resin expressed as 100% by mass, from the viewpoint of the printing durability of the printing plate in the step of preparing the photosensitive resin.

The photopolymerization initiator is a compound that absorbs light energy and generates a radical. Examples of the photopolymerization initiator include: a collapse photopolymerization initiator, a hydrogen abstraction photopolymerization initiator, and a compound having a moiety functioning as a hydrogen abstraction photopolymerization initiator and a moiety functioning as a collapse photopolymerization initiator in one and the same molecule. As the photopolymerization initiator, an organic carbonyl compound is preferable, and in particular, an aromatic carbonyl compound is suitable, from the viewpoint of the printing durability of the printing plate.

Specific examples of the photopolymerization initiator include: benzophenones such as benzophenone, 4,4-bis(diethylamino)benzophenone, 3,3',4,4'-benzophenone tetracarboxylic acid anhydride and 3,3',4,4'-tetramethoxybenzophenone; anthraquinones such as t-butylanthraquinone and 2-ethylanthraquinone; thioxanthones such as 2,4-diethylthioxanthone, isopropylthioxanthone and 2,4-dichlorothioxanthone; Michler ketone; acetophenones such as diethoxyacetophenone, 2,2-dimethoxy-phenylacetophenone, 2-hydroxy-2-methyl-1-phenylpropan-1-one, benzyldimethylketal, 1-hydroxycyclohexyl phenyl ketone, 2-methyl-2-morpholino(4-methylthiophenyl)propan-1-one, 2-methyl-1-(4-methylthiophenyl)-2-morpholino-propan-1-one, 2-benzyl-2-dimethylamino-1-(4-morpholinophenyl)-butanone and trichloroacetophenone; benzoin ethers such as benzoin methyl ether, benzoin ethyl ether, benzoin isopropyl ether and benzoin isobutyl ether; acylphosphine oxides such as 2,4,6-trimethylbenzoyldiphenylphosphine oxide, bis(2,6-dimethoxybenzoyl)-2,4,4-trimethylpentylphosphine oxide and bis(2,4,6-trimethylbenzoyl)-phenylphosphine oxide; methyl benzoylformate; 1,7-bisacridinylheptane; 9-phenylacridine; and azo compounds such as azobisisobutyronitrile, diazonium compounds and tetrazene compounds. These may be used each alone or in combinations of two or more thereof.

The content of the photopolymerization initiator in the photosensitive resin layer is preferably within a range from 0.1 to 10% by mass and more preferably within a range from 0.5 to 5% by mass in relation to the total amount of the photosensitive resin expresses as 100% by mass, from the viewpoint of the printing durability of the printing plate in the step of preparing the photosensitive resin.

In the photosensitive resin, various additives may also be added, if necessary. Examples of the various additives include a polar group-containing polymer, a plasticizer, a thermal polymerization inhibitor, an antioxidant, an ultraviolet absorber, and a dye.pigment.

Examples of the plasticizer include: hydrocarbon oils such as naphthenic oil and paraffin oil; conjugated diene rubbers mainly composed of liquid dienes such as liquid acrylonitrile-butadiene copolymer and liquid styrene-butadiene copolymer; and polystyrene having a number average molecular weight of 2,000 or less, sebacic acid esters and phthalic acid esters; these plasticizers may have hydroxyl groups or carboxyl groups at the terminals thereof. To these plasticizers, photopolymerizable reactive groups such as a (meth)acryloyl group may be imparted. These plasticizes may be used each alone or in combinations of two or more thereof.

As the thermal polymerization inhibitor.antioxidant, the thermal polymerization inhibitors.antioxidants usually used in the field of resin materials or rubber materials can be used. Specific examples of such polymerization inhibitors and antioxidants include phenolic and phosphite-based thermal polymerization inhibitors.antioxidants.

The content of each of such various derivatives is preferably 30% by mass or less and more preferably 20% by mass or less in relation to the total amount of the photosensitive resin expressed as 100% by mass.

The photosensitive resin layer can be prepared by various methods. For example, the composition of a photosensitive resin to be the material of the photosensitive resin layer is dissolved and mixed in an appropriate solvent such as chloroform, tetrachloroethylene, methyl ethyl ketone or toluene, and the resulting solution is casted into a mold and the solvent is evaporated to prepare a plate. Alternatively, without using any solvent, the composition is kneaded with a kneader or a roll mill, and can be molded into a plate having an intended thickness of about 2.5 mm with an apparatus such as an extruder, a molding machine or a press.

The photosensitive resin layer has adhesiveness at normal temperature, depending on the composition thereof in some cases. Accordingly, if necessary, a thin film (covering sheet) may be laminated on the surface of the photosensitive resin layer, for the purpose of making satisfactory the contact with the transparent image carrier to be superposed on the photosensitive resin layer at the time of plate-making, and at the same time, making satisfactory the releasability of the transparent image carrier. The covering sheet is obtained from a polymer such as polyethylene, polypropylene, polyester or polystyrene. The film is removed before the transparent image carrier is bonded.

For the purpose of improving the contact with the transparent image carrier, instead of the film, a solvent-soluble, thin and flexible protective layer may be disposed. The protective layer may be disposed, for example, as follows. Specifically, for example, a solvent-soluble polyamide, a partially saponified polyvinyl acetate or a cellulose ester is dissolved in a solvent such as toluene or isopropyl alcohol, the surface of the photosensitive resin layer is directly coated with the resulting solution, and thus the protective layer is formed. Alternatively, a covering sheet such as a polyester film or a polypropylene film is coated with the solution to form a protective layer, and then the covering sheet provided with the protective layer may be laminated on or compression bonded to the surface of the photosensitive resin layer so as to transfer the protective layer. When the transparent image carrier is bonded onto the protective layer and subjected to exposure, and then the unexposed area of the photosensitive resin layer is washed away, the protective layer is simultaneously removed, for example, by dissolution.

After the photosensitive resin layer is formed on the adhesive layer laminated on the polyester substrate, the polyester film and the photosensitive resin layer are made to adhere to each other by laminating or press processing with a device such as a roll, and thus a photosensitive resin structure is formed. By further applying hot-pressing after the lamination processing, a photosensitive resin structure having more satisfactory thickness precision can be obtained.

By using the photosensitive resin structure, a printing plate can be made. Hereinafter, an example of the plate-making method is described. Specifically, exposure is performed through the polyester film to photocure the photosensitive resin layer to form a thin uniform cured layer (back exposure). Next, on the photosensitive resin layer, a negative film such as polyester film is partially formed, image exposure is performed through the negative film on the photosensitive resin layer, and the photosensitive resin is cured according to the pattern of the negative film (relief exposure). Subsequently, the unexposed area (namely, the uncured area) in the photosensitive resin layer is cleaned with a developing liquid to form the intended image, namely, the relief image, and thus a printing plate can be obtained.

Examples of the light source used for photocuring the photosensitive resin layer include a high-pressure mercury lamp, an ultraviolet fluorescent lamp, a carbon arc lamp, a xenon lamp and sunlight.

At the time of exposure, it is preferable to perform exposure over the whole area through the polyester film, for the purpose of making stronger the adhesion between the polyester film and the photosensitive resin layer or making stabler the relief image against the stress at the time of washing away of the unexposed area.

Either of the exposure through the negative film and the exposure through the polyester film may be performed first; however, from the viewpoint of the image reproducibility, it is preferable to first perform the exposure through the polyester film.

The photosensitive resin layer is exposed through the negative film to form the image, and then the unexposed area is washed away by using a developing solvent. Examples of such a developing solvent include: chlorine-based organic solvents such as 1,1,1-trichloroethane and tetrachloroethylene; esters such as heptyl acetate and 3-methoxybutyl acetate; hydrocarbons such as petroleum fraction, toluene and decaline; and the mixtures obtained by mixing alcohols such as propanol, butanol or pentanol with these solvents.

As the developing liquid, aqueous developing liquids are preferable from the viewpoint of the work environment. Examples of the aqueous developing liquid include a mixed liquid of water and an alcohol, and an aqueous developing liquid including an additive such as a surfactant.

Examples of the surfactant include: nonionic, anionic, cationic and amphoteric surfactants; and also surfactants including two or more of these. In the surfactant, cleaning aids such as a cleaning promoter or a pH adjuster may also be mixed if necessary.

Examples of the anionic surfactant include: linear alkyl benzenesulfonic acid salts including an alkyl group having 8 to 16 carbon atoms on average; α-olefin sulfonic acid salts having 10 to 20 carbon atoms on average; dialkylsulfosuccinic acid salts including an alkyl group or an alkenyl group having 4 to 10 carbon atoms; sulfonic acid salts of fatty acid lower alkyl esters; alkyl sulfuric acid salts having 10 to 20 carbon atoms on average; alkyl ether sulfuric acid salts including a linear or branched alkyl group or alkenyl group having 10 to 20 carbon atoms on average, and including 0.5 to 8 moles of ethylene oxide added thereto; and saturated or unsaturated fatty acid salts having 10 to 22 carbon atoms on average.

Examples of the cationic surfactant include alkylamine salts, alkylamine ethylene oxide adducts, alkyltrimethylammonium salts, alkyldimethylbenzylammonium salts, sapamine-type quaternary ammonium salts and pyridinium salts.

Examples of the nonionic surfactant include: polyethylene glycol-type higher alcohol alkylene oxide adducts, alkylphenol alkylene oxide adducts, fatty acid alkylene oxide adducts, polyhydric alcohol fatty acid ester alkylene oxide adducts, higher alkylamine alkylene oxide adducts, fatty acid amide alkylene oxide adducts, alkylene oxide adducts and polypropylene glycol alkylene oxide adducts of oils and fats, fatty acid esters of polyhydric alcohol-type glycerols, fatty acid esters of pentaerythritol, fatty acid esters of sorbitol and sorbitan, fatty acid esters of sucrose, alkyl ethers of polyhydric alcohols and fatty acid amides of alkanolamines.

Examples of the amphoteric surfactant include sodium lauryl amino propionate and lauryldimethylbetaine.

The concentration of the surfactant is not particularly limited; however, the concentration of the surfactant is usually set in a range from 0.5 to 10% by mass in relation to the total amount of the cleaning liquid.

The washing away of the unexposed area is performed by jetting from a nozzle or by brushing with a brush. After the washing away, the step of rinse cleaning.drying may be followed by post-exposure.

EXAMPLES

Hereinafter, the present invention is described more specifically with reference to Examples. The evaluation methods in following Examples and Comparative Examples are as follows.

(1) Carboxyl Group Content of Polyester Resin

In 50 ml of chloroform and/or dioxane, 1 g of the polyester resin was dissolved, the resulting solution was subjected to a titration with KOH by using cresol red as an indicator, and the number of milligrams of KOH consumed for neutralization was taken as the carboxyl group content.

(2) Glass Transition Temperature of Polyester Resin

The glass transition temperature of the polyester resin was measured with 10 mg of the polyester resin as the sample, by using a differential scanning calorimeter (trade name: DSC7, manufactured by Perkin-Elmer Corp.) under the condition of the temperature increase rate of 10° C./min.

(3) Need or No Need of Release Film

In the case where the polyester film with the adhesive layer formed thereon was wound around a paper cylinder, when the adhesiveness of the adhesive layer was too strong, a release film (trade name: OP U-O, manufactured by Tohcello Co., Ltd.) for preventing the blocking was used.

In the present invention, a product in which no release film was used was defined as practically usable.

(4) Adhesive Force

A printing plate was cut to a size of 1 cm in width and 15 cm in length, and allowed to stand in a constant-temperature constant-humidity chamber set at a temperature of 23° C. and a relative humidity of 50%, for one day to prepare a specimen. Then, the photosensitive resin layer and the polyester film including the adhesive layer and the substrate were peeled off from each other from one lengthwise edge of the specimen over a length of about 5 cm. The adhesive layer of the peeled polyester film and a metal plate were bonded to each other with a double-sided tape (trade name: Scotch ST-416, manufactured by 3M Corp.) and set in the Autograph (trade name: Autograph AG-X, manufactured by Shimadzu Corp.). Thus, a peeling test was performed by applying a peeling force in a direction of 180° at a rate of 50 mm/m in such a way that the photosensitive resin layer and the polyester film were peeled off from each other. The evaluation was performed on the basis of the following standards.

Excellent: The photosensitive resin layer and the polyester film cannot be peeled off from each other.

Good: Peel strength is 9.8 N/cm or more.

Poor: Peel strength is less than 9.8 N/cm.

In the present invention, the case of being Excellent and the case of being Good were determined to be practically usable.

(5) Printability

By using, as a printing plate, each of the photosensitive resin structures obtained in Example and Comparative Examples, printing was performed with a flexographic printing machine (Model AI-3, manufactured by Iyo Kikai Seisakusho Co., Ltd.). Specifically, printing was performed on a corona-treated 30-μm thick polypropylene film (PA30, manufactured by Sun Tox Co., Ltd.) as a printing object, by fixing the photosensitive resin structure on a plate cylinder with a 0.35-mm thick cushion tape (1915, manufactured by 3M Corp.), by using an ester solvent-containing ink (trade name: XS-716, manufactured by Dainippon Ink and Chemicals, Inc.), and by using a 800-lpi anilox roll (cell capacity: 3.8 cm$^3$/m$^2$), at a printing speed of 80 m/min, over a length of 10000 m.

Whether or not peeling occurred between the polyester film and the photosensitive resin layer, due to the shear stress of the plate cylinder and the impression cylinder, was visually observed. Also, whether or not peeling occurred between the polyester film and the photosensitive resin layer, due to the stress exerted when the photosensitive resin structure fixed with a double-sided tape was peeled off from the plate cylinder after the completion of the printing, was visually observed. After the photosensitive resin structure was allowed to stand still in an environment at 40° C. for one month, the photosensitive resin structure was again mounted in the printing press to perform printing, and whether or not peeling occurred between the polyester film and the photosensitive resin layer was observed. Evaluation was performed on the basis of the following standards.

Good: In any of the foregoing cases, no peeling is observed.

Poor: In any of the forgoing cases, peeling is observed.

In the present invention, the case of being good was determined to be practically usable.

(6) Overall Evaluation

Overall evaluation was performed on the basis of the following standards.

Good: The case evaluated as practically usable in all the foregoing evaluations (3) to (5).

Poor: The case evaluated as practically unusable in one or more of the foregoing evaluations (3) to (5).

(Thermoplastic Elastomers Used in Adhesive Layer)

Tufprene A (styrene-butadiene copolymer, number average molecular weight: 100,000, styrene proportion: 40% by weight) (manufactured by Asahi Kasei Chemicals Corp.)

Tufprene 912 (styrene-butadiene copolymer, number average molecular weight: 100,000, styrene proportion: 40% by weight, reaction type) (manufactured by Asahi Kasei Chemicals Corp.)

Tufprene 315P (styrene-butadiene copolymer, styrene proportion: 20% by weight) (manufactured by Asahi Kasei Chemicals Corp.)

Asaprene 650P (styrene-butadiene copolymer, styrene proportion: 65% by weight) (manufactured by Asahi Kasei Chemicals Corp.)

D-1161P (styrene-isoprene copolymer, number average molecular weight: 190,000, styrene proportion: 15% by weight) (manufactured by Clayton Polymer Japan Co., Ltd.)

Hybrar 5125 (styrene-isoprene copolymer, number average molecular weight: 120,000, styrene proportion: 20%) (manufactured by Kuraray Co., Ltd.)

Quintac 3621C (styrene-isoprene copolymer, number average molecular weight: 280,000, styrene proportion: 15% by weight) (manufactured by Zeon Corp.)

Epofriend AT-501 (styrene-butadiene copolymer, number average molecular weight: 100,000, styrene proportion: 40% by weight, epoxy-modified product) (manufactured by Dicel Chemical Industries, Ltd.)

<Preparation of Polyester Resin Used in Adhesive Layer>

(Polyester 1)

In an autoclave, a mixture composed of 1,200 g of terephthalic acid, 253 g of isophthalic acid, 374 g of ethylene glycol and 730 g of neopentyl glycol was heated at 250° C. for 4 hours to conduct esterification reaction. Subsequently, 0.26 g of germanium dioxide was added as a catalyst to the reaction mixture, the temperature of the reaction mixture was increased to 280° C. in 30 minutes, and the pressure was gradually reduced to 13 Pa in one hour. The polycondensation reaction was further continued, the pressure was made to reach normal pressure with nitrogen gas after 1.5 hours, the temperature was decreased to 260° C., 19 g of isophthalic acid and 23 g of phthalic anhydride were added to the reaction mixture and stirred at 255° C. for 30 minutes, and the reaction mixture was dispensed in a sheet shape and cooled to yield the polyester 1. The carboxyl group content and the glass transition temperature of the polyester 1 were found to be 11 mg KOH/g and 50° C., respectively.

(Polyester 2)

In an autoclave, a mixture composed of 1,100 g of terephthalic acid, 290 g of isophthalic acid, 335 g of adipic acid, 35 g of trimellitic anhydride, 730 g of ethylene glycol and 360 g of neopentyl glycol was heated at 255° C. for 3 hours to conduct esterification reaction. Subsequently, 0.25 g of germanium dioxide was added as a catalyst to the reaction mixture, the temperature of the reaction mixture was increased to 280° C. in 30 minutes, and the pressure was gradually reduced to 11 Pa in one hour. The polycondensation reaction was further continued, the pressure was made to reach normal pressure with nitrogen gas after 1.5 hours, the temperature was decreased to 260° C., 19 g of isophthalic acid and 26 g of trimellitic anhydride were added to the reaction mixture and stirred at 250° C. for 30 minutes, and the reaction mixture was dispensed in a sheet shape and cooled to yield the polyester 2. The carboxyl group content and the glass transition temperature of the polyester 2 were found to be 23 mg KOH/g and 36° C., respectively.

(Polyester 3)

In an autoclave, a mixture composed of 1,560 g of terephthalic acid, 160 g of isophthalic acid, 90 g of trimellitic anhydride, 310 g of ethylene glycol and 900 g of neopentyl glycol was heated at 260° C. for 2.5 hours to conduct esterification reaction. Subsequently, 0.23 g of tetrabutyl titanate was added as a catalyst to the reaction mixture, the temperature of the reaction mixture was increased to 280° C. in 30 minutes, and the pressure was gradually reduced to 10 Pa in one hour. The polycondensation reaction was further continued, the pressure was made to reach normal pressure with nitrogen gas after 1.5 hours, the temperature was decreased to 260° C., 9 g of trimellitic acid and 30 g of trimellitic anhydride were added to the reaction mixture and stirred at 255° C. for 45 minutes, and the reaction mixture was dispensed in a sheet shape and cooled to yield the polyester 3. The carboxyl group content and the glass transition temperature of the polyester 3 were found to be 48 mg KOH/g and 63° C., respectively.

(Polyester 4)

In an autoclave, a mixture composed of 1,100 g of terephthalic acid, 19 g of isophthalic acid, 660 g of adipic acid, 35 g of trimellitic anhydride, 730 g of ethylene glycol and 360 g of neopentyl glycol was heated at 260° C. for 3 hours to conduct esterification reaction. Subsequently, 0.25 g of germanium dioxide was added as a catalyst to the reaction mixture, the temperature of the reaction mixture was increased to 280° C. in 30 minutes, and the pressure was gradually reduced to 15 Pa in one hour. The polycondensation reaction was further continued, the pressure was made to reach normal pressure with nitrogen gas after 1.5 hours, the temperature was decreased to 260° C., 16 g of isophthalic acid and 26 g of trimellitic anhydride were added to the reaction mixture and stirred at 245° C. for 45 minutes, and the reaction mixture was dispensed in a sheet shape and cooled to yield the polyester 4. The carboxyl group content and the glass transition temperature of the polyester 4 were found to be 13 mg KOH/g and −5° C., respectively.

(Polyester 5)

In an autoclave, a mixture composed of 1,600 g of terephthalic acid, 60 g of isophthalic acid, 450 g of ethylene glycol and 600 g of neopentyl glycol was heated at 240° C. for 3 hours to conduct esterification reaction. Subsequently, 0.20 g of tetrabutyl titanate was added as a catalyst to the reaction mixture, the temperature of the reaction mixture was increased to 280° C. in 30 minutes, and the pressure was gradually reduced to 13 Pa in 1.5 hours. The polycondensation reaction was further continued, the pressure was made to reach normal pressure with nitrogen gas after 4 hours, and the reaction mixture was dispensed in a strand shape and cooled to yield the polyester 5. The carboxyl group content and the glass transition temperature of the polyester 5 were found to be 1 mg KOH/g and 83° C., respectively.

(Polyester 6)

In an autoclave, a mixture composed of 1,500 g of terephthalic acid, 160 g of isophthalic acid, 300 g of 1,2-prolanediol, 1,720 g of isosorbide and 1.3 g of hydroxybutyl tin oxide was heated at 240° C. for 3 hours to conduct esterification reaction. Subsequently, 3.4 g of tetrabutyl titanate was added as a catalyst to the reaction mixture, the temperature of the reaction mixture was increased to 280° C. in 30 minutes, and the pressure was gradually reduced to 10 Pa in 1.5 hours. The polycondensation reaction was further continued, the pressure was made to reach normal pressure with nitrogen gas after 8 hours, the temperature was decreased to 260° C., 20 g of trimellitic acid and 23 g of trimellitic anhydride were added to the reaction mixture and stirred at 255° C. for 30 minutes, and the reaction mixture was dispensed in a sheet shape and cooled to yield the polyester 6. The carboxyl group content and the glass transition temperature of the polyester 6 were found to be 45 mg KOH/g and 139° C., respectively.

(Polyester 7)

In an autoclave, a mixture composed of 1,600 g of terephthalic acid, 60 g of isophthalic acid, 450 g of ethylene glycol and 600 g of neopentyl glycol was heated at 240° C. for 3 hours to conduct esterification reaction. Subsequently, 0.20 g of tetrabutyl titanate was added as a catalyst to the reaction mixture, the temperature of the reaction mixture was increased to 280° C. in 30 minutes, and the pressure was gradually reduced to 13 Pa in 1.5 hours. The polycondensation reaction was further continued, the pressure was made to reach normal pressure with nitrogen gas after 6 hours, the temperature was decreased to 260° C., 23 g of trimellitic acid and 5 g of pyromellitic acid were added to the reaction mixture and the temperature was decreased to 240° C. under stirring, 30 g of trimellitic anhydride and 10 g of pyromellitic anhydride were added to the reaction mixture and stirred for 30 minutes, and the reaction mixture was dispensed in a sheet shape and cooled to yield the polyester 7. The carboxyl group content and the glass transition temperature of the polyester 7 were found to be 93 mg KOH/g and 53° C., respectively.

The compatibilizers used in the adhesive layer are shown below.

Gohsefimer L-7514 (manufactured by Nippon Synthetic Chemical Industry Co., Ltd., glass transition temperature: 45° C.) (polyvinyl acetate)

Aron S-1001 (manufactured by Toagosei Co., Ltd., glass transition temperature: 41° C.) (styrene-acryl copolymer resin)

Aron S-1017 (manufactured by Toagosei Co., Ltd., glass transition temperature: 95° C.) (acrylic resin)

ARUFON UFX-5000 (manufactured by Toagosei Co., Ltd., glass transition temperature: 65° C.) (styrene-acryl copolymer resin)

ARUFON XG-4050 (manufactured by Toagosei Co., Ltd., glass transition temperature: 70° C.) (styrene-acryl copolymer resin)

ARUFON UM-9030 (manufactured by Toagosei Co., Ltd., glass transition temperature: 56° C.) (styrene-acryl copolymer resin)

POLYMENT NK-350 (manufactured by Nippon Shokubai Co., Ltd., glass transition temperature: 40° C.) (acrylic resin)

POLYMENT NK-380 (manufactured by Nippon Shokubai Co., Ltd., glass transition temperature: 100° C.) (acrylic resin)

Vanaresin PSY-C1 (manufactured by Shin-Nakamura Chemical Co., Ltd., glass transition temperature: 67° C.) (acrylic resin)

Evaflex 40W·X (manufactured by Du Pont-Mitsui Polychemical Co., Ltd., glass transition temperature: −28° C.) (ethylene-vinyl acetate copolymer resin)

Aron SP-1350 (manufactured by Toagosei Co., Ltd., glass transition temperature: 6° C.) (acrylic resin)

The thermoplastic elastomers used in the photosensitive resin layer are shown below.

Styrene-butadiene block copolymer (trade name: Tufprene A, manufactured by Asahi Kasei Chemicals Corp., styrene proportion: 40% by weight)

Styrene-isoprene block copolymer (trade name: D-1161P, manufactured by Clayton Polymer Japan Co., Ltd., styrene proportion: 15% by weight)

Styrene-butadiene block copolymer (trade name: Tufprene 315P, manufactured by Asahi Kasei Chemicals Corp/, styrene proportion: 20% by weight)

The ethylenically unsaturated compounds used in the photosensitive resin layer are shown below.

1,9-Nonanediol diacrylate (trade name: 1,9-bis(acryloyloxy)nonane, manufactured by Tokyo Chemical Industry Co., Ltd.)

Dioctyl fumarate

Lauryl maleimide (trade name: N-dodecyl maleimide, manufactured by Daiwakasei Industry Co., Ltd.)

The photopolymerization initiator used in the photosensitive resin layer is shown below.

2,2-Dimethoxy-2-phenyl acetophenone (trade name: Irgacure 651, manufactured by Ciba Japan K.K.)

The plasticizer used as an additive in the photosensitive resin layer is shown below.

Liquid polybutadiene (trade name: B-2000, manufactured by Nippon Petrochemicals Co., Ltd.)

Table 1 shows the compositions of the photosensitive resin.

TABLE 1

|  |  | A | B | C | D | E |
|---|---|---|---|---|---|---|
| Composition | Tufprene A | 60 | — | — | — | — |
|  | Tufprene 315P | — | — | — | — | 60 |
|  | D-1161P | — | 60 | 90 | 90 | — |
|  | B-2000 | 30 | 30 | — | — | 30 |
|  | Irgacure 651 | 2 | 2 | 2 | 2 | 2 |
| Ethylenically unsaturated compounds | 1,9-Nonanediol diacrylate | 7 | 7 | 7 | — | 7 |
|  | Dioctyl fumarate | — | — | — | 5 | — |
|  | Lauryl maleimide | — | — | — | 2 | — |

*In Table 1, the numerical values are given in units of parts by mass.
*In Table 1, "—" means no mixing.

<Preparation of Photosensitive Resin Layer>

The starting materials were kneaded with a kneader so as to give each of the compositions (A) to (E) shown in Table 1, the resulting kneaded product was extruded on a 100 μm-thick polyester film (trade name: SA-100, manufactured by Unitika Ltd.) as a covering sheet with a 4 to 6 μm-thick polyamide film (trade name: Macromelt 6900, manufactured by Henkel Hakusuisha, Ltd.) disposed as a protective layer thereon. A calender roll heated to 130° C. was allowed to pass on each of the resin compositions formed by extrusion, and thus 5 types of 3-mm thick photosensitive resin layers were obtained.

Example 1

A 125 μm-thick polyester film (trade name: SA-125, manufactured by Unitika Ltd.) as a substrate was coated with an organic solvent (organic solvent type alcohol/toluene/MEK mixed solvent) dissolving the adhesive component in the composition shown in Table 2 with a gravure coater (trade name: FS-29, manufactured by Kabushiki Kaisha Higashitani Tekkosho), and then heat-treated at 140° C. for 5 seconds to remove the solvent. The adhesive layer thus formed was found to have a thickness of 2 μm. The polyester film including the adhesive layer formed on the substrate was wound around a paper cylinder. In this case, when the adhesive layer has adhesiveness at normal temperature, a release film (trade name: OP U-O, manufactured by Tohcello Co., Ltd.) was used for the purpose of preventing blocking.

TABLE 2

|  |  |  | Examples |  |  |  |  |  |  |  |  |
|---|---|---|---|---|---|---|---|---|---|---|---|
|  |  |  | 1 | 2 | 3 | 4 | 5 | 6 | 7 | 8 | 9 |
| Composition | Thermoplastic elastomers | Tufprene 912 | 40 | — | 45 | 55 | — | 64 | 25 | 25 | — |
|  |  | Tufprene A | — | 50 | — | — | 10 | — | — | — | — |
|  |  | Tufprene 315P | — | — | — | — | — | — | — | — | — |
|  |  | Asaprene 650P | — | — | — | — | — | — | — | — | — |
|  |  | D-1161P | — | — | — | — | — | — | — | — | — |
|  |  | Hybrar 5125 | — | — | — | — | — | — | — | — | — |
|  |  | Quintac 3621C | — | — | — | — | — | — | — | — | — |
|  |  | AT-501 | — | — | — | — | — | — | — | — | 45 |
|  | Polyester resins | Polyester 1 | 30 | — | — | — | — | — | 65 | — | — |
|  |  | Polyester 2 | — | — | 25 | — | 40 | — | — | — | 5 |
|  |  | Polyester 3 | — | 25 | — | 25 | — | 18 | — | 25 | — |
|  |  | Polyester 4 | — | — | — | — | — | 8 | — | — | — |
|  |  | Polyester 5 | — | — | — | — | — | — | — | — | 5 |
|  |  | Polyester 6 | — | — | — | — | — | — | — | — | — |
|  |  | Polyester 7 | — | — | — | — | — | — | — | — | — |
|  | Compatibilizers | S-1017 | 30 | — | — | — | — | — | — | 25 | — |
|  |  | UFX-5000 | — | — | — | — | — | 10 | — | — | — |
|  |  | XG-4050 | — | — | — | — | — | — | — | — | 45 |
|  |  | UM-9030 | — | 25 | — | — | — | — | — | — | — |
|  |  | NK-350 | — | — | 30 | — | — | — | — | — | — |
|  |  | NK-380 | — | — | — | 20 | — | — | — | — | — |
|  |  | PSY-C1 | — | — | — | — | 50 | — | 10 | — | — |
|  |  | SP-1350 | — | — | — | — | — | — | — | 25 | — |
|  |  | L-7514 | — | — | — | — | — | — | — | — | — |

TABLE 2-continued

| | | | | | | | | | | |
|---|---|---|---|---|---|---|---|---|---|---|
| Carboxyl group content of polyester resin(s) (mgKOH/g) | | | 11 | 48 | 23 | 48 | 23 | 38 | 11 | 48 | 12 |
| Glass transition temperature of polyester resin (° C.) | | | 50 | 63 | 36 | 63 | 36 | 43 | 50 | 63 | 60 |
| Evaluations | Need or no need of release film | | No need | No need | No need | No need | No need | No need | No need | No need | No need |
| | Adhesiveness | | EX | EX | EX | GD | EX | EX | EX | GD | GD |
| | Printability | | GD | GD | GD | GD | GD | GD | GD | GD | GD |
| | Photosensitive resin lowest in adhesive force in adhesiveness evaluation and photosensitive resin used for printability test | | C | D | C | D | B | C | C | C | C |
| | Overall evaluation | | GD | GD | GD | GD | GD | GD | GD | GD | GD |

| | | | Examples | | | | | | | |
|---|---|---|---|---|---|---|---|---|---|---|
| | | | 10 | 11 | 12 | 13 | 14 | 15 | 16 | 17 |
| Composition | Thermoplastic elastomers | Tufprene 912 | 40 | — | — | — | — | — | — | 40 |
| | | Tufprene A | — | — | 30 | — | — | — | 45 | — |
| | | Tufprene 315P | — | 40 | — | — | — | — | — | — |
| | | Asaprene 650P | — | — | 20 | — | — | — | — | — |
| | | D-1161P | — | — | — | 45 | — | — | — | — |
| | | Hybrar 5125 | — | — | — | — | 45 | — | — | — |
| | | Quintac 3621C | — | — | — | — | — | 40 | — | — |
| | | AT-501 | — | — | — | — | — | — | — | — |
| | Polyester resins | Polyester 1 | 30 | — | 20 | — | — | 30 | — | — |
| | | Polyester 2 | — | — | — | 25 | — | — | — | — |
| | | Polyester 3 | — | 30 | — | — | 35 | — | — | — |
| | | Polyester 4 | — | — | — | — | — | — | — | — |
| | | Polyester 5 | — | — | — | — | — | — | — | — |
| | | Polyester 6 | — | — | — | — | — | — | 25 | — |
| | | Polyester 7 | — | — | — | — | — | — | — | 30 |
| | Compatibilizers | S-1017 | — | — | — | 15 | — | — | — | 30 |
| | | UFX-5000 | — | — | — | — | — | — | — | — |
| | | XG-4050 | — | — | — | — | 20 | — | — | — |
| | | UM-9030 | — | — | — | 15 | — | — | — | — |
| | | NK-350 | — | 15 | — | — | — | — | 30 | — |
| | | NK-380 | — | 15 | — | — | — | 30 | — | — |
| | | PSY-C1 | — | — | 30 | — | — | — | — | — |
| | | SP-1350 | — | — | — | — | — | — | — | — |
| | | L-7514 | 30 | — | — | — | — | — | — | — |
| Carboxyl group content of polyester resin(s) (mgKOH/g) | | | 11 | 48 | 11 | 23 | 48 | 11 | 45 | 93 |
| Glass transition temperature of polyester resin (° C.) | | | 50 | 63 | 50 | 36 | 63 | 50 | 139 | 53 |
| Evaluations | Need or no need of release film | | No need | No need | No need | No need | No need | No need | No need | No need |
| | Adhesiveness | | GD | GD | EX | GD | GD | GD | GD | GD |
| | Printability | | GD | GD | GD | GD | GD | GD | GD | GD |
| | Photosensitive resin lowest in adhesive force in adhesiveness evaluation and photosensitive resin used for printability test | | C | A | D | A | A | A | D | B |
| | Overall evaluation | | GD | GD | GD | GD | GD | GD | GD | GD |

*In Table 2, the contents are given in parts by mass (solid contents).
*In Table 2, "—" means no mixing.
*EX: Excellent
*GD: Good
*PR: Poor The abbreviations in Table 2 and Table 3 presented below represent the following products.
L-7514: Gohsefimer L-7514
s-1001: Aron S-1001
S-1017: Aron S-1017
UFX-5000: ARUFON UFX-5000
XG-4050: ARUFON XG-4050
UM-9030: ARUFON UM-9030
NK-350: POLYMENT NK-350
NK-380: POLYMENT NK-380
PSY-C1: Vanaresin PSY-C1
40W•X: Evaflex 40W•X
SP-1350: Aron SP-1350

The laminate films in which the photosensitive resin layers made of the resin compositions (A) to (E) were formed on a 100 μm-thick polyester film were prepared respectively as described above with a protective layer. Each of these laminate films was set in a laminator, and was dry laminated on the polyester film, including the adhesive layer laminated on the substrate, of the present invention on a metal roll maintained at 110° C., to yield the photosensitive resin structure of the present invention. Subsequently, the 100 μm-thick polyester film was peeled off to yield a photosensitive resin structure having a protective layer made of polyamide. On the protective layer remaining on the photosensitive resin layer, a negative film made of a polyester was allowed to adhere. Next, with an exposure unit (trade name: AFP-1500, manufactured by Asahi Kasei E-Materials Corp.), by using an ultraviolet fluorescent lamp having a central wavelength at 370 nm, a whole area exposure was performed from the polyester film side at 300 mJ/cm². Next, successively, from the negative film side, an image exposure (whole area) at 8000 mJ/cm² was performed. As the patterns of the negative film, the patterns having a number of lines of 133 lpi and each having a halftone dot of 20%, 40%, 60%, 80% and 100% (solid) (the size of each pattern being 10 cm×75 cm) were used.

In this case, the exposure intensity was measured with an UV illuminance meter (trade name: Model MO-2, manufactured by Orc Manufacturing Co., Ltd.). Specifically, the intensity of the ultraviolet ray from the side for performing the back exposure, namely, from the lamp on the lower side was measured on a glass plate by using a UV-35 filter and found to be 4.0 mW/cm$^2$; the intensity of the ultraviolet ray from the side for performing the relief exposure, namely, from the lamp on the upper side was measured and found to be 7.8 mW/cm$^2$.

Next, the photosensitive resin structure was bonded, with a double-sided tape, to rotary cylinder of a developing machine (trade name: AFP-1500, manufactured by Asahi Kasei E-Materials Corp.). Then, development was performed with a liquid mixture of (tetrachloroethylene)/(n-butanol)=3/1 (volume ratio) at a liquid temperature of 25° C. for 5 minutes. Subsequently, the unexposed area was washed away, and the developed photosensitive resin structure was dried at 60° C. for 1 hour, and further subjected to post-exposure to yield a printing plate.

In the solid area of the printing plate, the evaluation of the adhesive force between the polyester film including the substrate and the adhesive layer and the cured photosensitive resin was performed as follows. Specifically, for the polyester film and the photosensitive reins according to (A) to (E), the respective adhesive forces were evaluated, and the lowest result of the adhesive force is shown in Table 2. For each of the printing plates satisfactory in the adhesion between the photosensitive resin and the polyester film, the evaluation of the printability was performed, and the evaluation results are shown in Table 2.

Examples 2 to 17 and Comparative Examples 1 to 4

In each of Examples 2 to 17 and Comparative Examples 1 to 4, the composition of the adhesive layer was altered from the composition of the adhesive layer in Example 1 as shown in Table 2 or 3. In each of Examples 2 to 17 and Comparative Examples 1 to 4, a photosensitive resin structure was obtained otherwise in the same manner as in Example 1. The evaluation of the adhesiveness and the evaluation of the printability were performed in the same manner as in Example 1. In the case where the adhesiveness was evaluated as "Poor," no evaluation of the printability was performed. The evaluation results of Examples are shown in Table 2, and the evaluation results of Comparative Examples are shown in Table 3.

TABLE 3

| | | | Comparative Examples | | | |
|---|---|---|---|---|---|---|
| | | | 1 | 2 | 3 | 4 |
| Composition | Thermoplastic elastomers | Tufprene 912 | — | 45 | — | — |
| | | Tufprene A | 45 | — | 50 | 54 |
| | | AT-501 | — | — | — | — |
| | Polyester resins | Polyester 1 | — | — | 25 | 13 |
| | | Polyester 2 | — | — | — | — |
| | | Polyester 3 | — | — | — | — |
| | | Polyester 4 | 15 | — | — | — |
| | | Polyester 5 | 10 | 25 | — | 13 |
| | Compatibilizers | S-1001 | — | 30 | — | — |
| | | S-1017 | 30 | — | — | — |
| | | 40W•X | — | — | 25 | — |
| | | SP-1350 | — | — | — | 20 |
| Carboxyl group content of polyester resin(s) (mgKOH/g) | | | 8 | 1 | 11 | 6 |
| Glass transition temperature of polyester resin (° C.) | | | 30 | 83 | 50 | 67 |
| Evaluations | Need or no need of release film | | Need | No need | Need | Need |
| | Adhesiveness | | PR | PR | EX | PR |
| | Printability | | No evaluation | No evaluation | GD | No evaluation |
| | Photosensitive resin lowest in adhesive force in adhesiveness evaluation and photosensitive resin used for printability test | | No evaluation | No evaluation | D | No evaluation |
| | Overall evaluations | | PR | PR | PR | PR |

*In Table 3, the contents are given in parts by mass (solid contents).
*In Table 3, "—" means no mixing.
*EX Excellent
*GD: Good
*PR: Poor The photosensitive resin structures of Examples 1 to 17 were found to be excellent both in the adhesiveness and in the printability. Additionally, the photosensitive resin structures of Examples 1 to 17 did not develop the adhesiveness to an extent more than necessary at normal temperature, did not need a release film and were able to be produced by simple steps without causing increase in costs.

In Comparative Example 1, the carboxyl group content in the polyester resin included in the adhesive layer was too small, and hence the adhesive force was not sufficient. Additionally, the glass transition temperature of the polyester resin included in the adhesive layer was low, thus the adhesiveness was developed to an extent more than necessary at normal temperature, and hence a release film was needed.

In Comparative Example 2, the carboxyl group content of the polyester resin included in the adhesive layer was too small, and hence adhesive force was not sufficient.

In Comparative Example 3, the glass transition temperature of the compatibilizer included in the adhesive layer was low, thus the adhesiveness was developed to an extent more than necessary at normal temperature, and hence a release film was needed.

In Comparative Example 4, the carboxyl group content of the polyester resin included in the adhesive layer was too small, and hence the adhesive force was not sufficient. Additionally, the glass transition temperature of the compatibilizer included in the adhesive layer was low, thus the adhesiveness was developed to an extent more than necessary at normal temperature, and hence a release film was needed.

INDUSTRIAL APPLICABILITY

According to the present invention, it is possible to provide a polyester film in which an adhesive layer is laminated on a substrate, capable of strongly adhere to a photosensitive resin layer when made to adhere to the photosensitive resin layer, without modifying the composition of the photosensitive resin layer, namely, without impairing the intrinsic nature of the photosensitive resin layer. Accordingly, the present invention is extremely useful.

The invention claimed is:

1. A polyester film wherein an adhesive layer comprising
   a thermoplastic elastomer including a monovinyl substituted aromatic hydrocarbon and a conjugated diene,
   a polyester resin having a glass transition temperature of 35 to 150° C. and a carboxyl group content of 10 to 100 mg KOH/g, and
   a compatibilizer compatibilizing the thermoplastic elastomer and the polyester resin with each other, the compatibilizer being selected from polyvinyl acetate, acrylic resin and styrene-acryl copolymer and having a glass transition temperature of 35 to 150° C., is laminated on a polyester substrate.

2. The polyester film according to claim 1, being a base film for use in a photosensitive resin printing plate.

3. A photosensitive resin structure wherein a photosensitive resin layer is disposed on the adhesive layer of the polyester film according to claim 2.

4. The photosensitive resin structure according to claim 3, wherein the photosensitive resin layer comprises a thermoplastic elastomer, an ethylenically unsaturated compound and a photopolymerization initiator.

5. The photosensitive resin structure according to claim 4, wherein the thermoplastic elastomer included in the photosensitive resin layer comprises a first polymer block including a conjugated diene unit or a hydrogenated conjugated diene unit and a second polymer block including a vinyl aromatic hydrocarbon unit.

6. The photosensitive resin structure according to claim 4, wherein the thermoplastic elastomer included in the photosensitive resin layer comprises a first polymer block including a butadiene unit or a hydrogenated butadiene unit and a second polymer block including a vinyl aromatic hydrocarbon unit.

7. A photosensitive resin structure wherein a photosensitive resin layer is disposed on the adhesive layer of the polyester film according to claim 1.

8. The photosensitive resin structure according to claim 7, wherein the photosensitive resin layer comprises a thermoplastic elastomer, an ethylenically unsaturated compound and a photopolymerization initiator.

9. The photosensitive resin structure according to claim 8, wherein the thermoplastic elastomer included in the photosensitive resin layer comprises a first polymer block including a conjugated diene unit or a hydrogenated conjugated diene unit and a second polymer block including a vinyl aromatic hydrocarbon unit.

10. The photosensitive resin structure according to claim 8, wherein the thermoplastic elastomer included in the photosensitive resin layer comprises a first polymer block including a butadiene unit or a hydrogenated butadiene unit and a second polymer block including a vinyl aromatic hydrocarbon unit.

* * * * *